United States Patent
Kamiya et al.

(10) Patent No.: US 9,425,429 B2
(45) Date of Patent: Aug. 23, 2016

(54) ORGANIC EL DISPLAY DEVICE

(71) Applicant: Japan Display Inc., Tokyo (JP)

(72) Inventors: Akinori Kamiya, Tokyo (JP); Kaichi Fukuda, Tokyo (JP); Daisuke Kato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/822,305

(22) Filed: Aug. 10, 2015

(65) Prior Publication Data
US 2016/0043346 A1 Feb. 11, 2016

(30) Foreign Application Priority Data
Aug. 11, 2014 (JP) ................................. 2014-163679

(51) Int. Cl.
*H01L 33/00* (2010.01)
*H01L 51/52* (2006.01)
*H01L 27/32* (2006.01)

(52) U.S. Cl.
CPC ........ *H01L 51/5253* (2013.01); *H01L 27/3246* (2013.01); *H01L 51/5246* (2013.01); *H01L 27/3258* (2013.01)

(58) Field of Classification Search
CPC ....... H01L 33/62; H01L 33/486; H01L 33/60; H01L 2924/01079; H01L 2224/48
USPC ........................ 257/40, 81, 99, 100, 433, 700
See application file for complete search history.

(56) References Cited

U.S. PATENT DOCUMENTS

| | | | | |
|---|---|---|---|---|
| 7,309,269 | B2 * | 12/2007 | Yamazaki | ............... C23C 14/24 445/24 |
| 2002/0149730 | A1 | 10/2002 | Jeong et al. | |
| 2005/0285522 | A1 | 12/2005 | Han et al. | |
| 2007/0176548 | A1 | 8/2007 | Kim et al. | |

FOREIGN PATENT DOCUMENTS

| | | |
|---|---|---|
| JP | 2002-311853 A | 10/2002 |
| JP | 2005-504652 A | 2/2005 |
| JP | 2006-004909 A | 1/2006 |
| JP | 2007-200838 A | 8/2007 |
| WO | 03/028903 A2 | 4/2003 |

* cited by examiner

Primary Examiner — Quoc Hoang
(74) Attorney, Agent, or Firm — TYPHA IP LLC (57) ABSTRACT

A bank layer includes projecting portions swollen toward in a thickness direction of a first substrate in an adhesion area. A multi-barrier includes a portion, in which a organic barrier is not disposed, on an upper side of the projecting portions. Therefore, it is possible to obtain, in the adhesion area, a portion in which a first inorganic barrier layer and a second inorganic barrier layer directly come in contact with each other. In an organic EL display device including the multi-barrier formed of an organic material and an inorganic material, it is possible to prevent two facing substrates from being separated from each other.

10 Claims, 4 Drawing Sheets

ORGANIC EL DISPLAY DEVICE

CROSS-REFERENCE TO RELATED APPLICATION

The present application claims priority from Japanese application JP2014-163679 filed on Aug. 11, 2014, the content of which is hereby incorporated by reference into this application.

BACKGROUND OF THE INVENTION

1. Field of the Invention

The present invention relates to an organic EL display device.

2. Description of the Related Art

Organic EL display devices include a first substrate on which an organic layer including a light emitting layer is formed, and a second substrate facing the first substrate. A sealing material is disposed along an outer periphery of the second substrate. The outer periphery of the second substrate is bonded to the first substrate by using the sealing material. For example, JP2006-004909A, JP2002-311853A, and JP2007-200838A disclose the sealing material. When moisture infiltrates into the organic layer, the organic layer is deteriorated, and thereby the quality of an image is deteriorated. Therefore, a number of the organic EL display devices includes a barrier which covers the organic layer and prevents moisture from infiltrating into the organic layer. JP2005-504652A discloses a barrier formed of a plurality of layers.

SUMMARY OF THE INVENTION

In a process of forming the first substrate, a pin hole may be caused in a barrier due to a foreign particle such as dust in some cases. When the pin hole is caused, moisture infiltrates into the pin hole and thereby an organic layer is deteriorated. The inventors of the present application have examined a multi-barrier structure formed of a plurality of barrier layers which are formed of inorganic materials, and an organic barrier which is formed of organic materials. The first barrier layer covers the organic layer. The organic barrier is disposed on a first inorganic barrier layer. When foreign particle exists on the first inorganic barrier layer, the organic barrier is formed so as to surround the foreign particle. A second inorganic barrier layer covers the first inorganic barrier layer and the organic barrier. According to the multi-barrier, the organic barrier is formed around the foreign particle, and an uneven surface (that is, a difference in level) around the foreign particle is decreased by the organic barrier. Therefore, even when the thickness of the second inorganic barrier layer is made small, the second inorganic barrier layer can completely cover the foreign particle. As a result, it is possible to efficiently prevent moisture from infiltrating into the organic layer. The organic barrier is, for example, formed as follows. A solvent including the organic material is made into a sprayed state and then sprayed onto the first inorganic barrier layer. The organic material on the first inorganic barrier layer is moved on the first inorganic barrier layer due to surface tension thereof, thereby forming a liquid droplet. When the foreign particle exists, the organic material coheres around the foreign particle due to the surface tension.

Incidentally, adhesive properties between the organic material and the inorganic material are not satisfactory, and thus the organic barrier and the inorganic barrier layer are likely to be separated. Since the multi-barrier is formed on the entire surface of the first substrate, the sealing material is bonded to the first substrate via the multi-barrier. When the multi-barrier is formed of the organic barrier and the inorganic barrier layer, the outer periphery of the second substrate is likely to be separated from the first substrate due to low adhesive properties between the organic barrier and the inorganic barrier layer.

An object of the invention is to provide an organic EL display device which includes a multi-barrier formed of an organic material and an inorganic material so as to prevent two facing substrates from being separated from each other.

(1) According to an aspect of the invention, there is provided an organic EL display device including: a first substrate; a second substrate facing the first substrate; a sealing material disposed between the first substrate and the second substrate; an adhesion area overlapping a position of the sealing material in planar view of the first substrate and the second substrate; an organic layer formed on the first substrate, and including a light emitting layer; a multi-barrier formed on the first substrate to cover the organic layer, and including a first inorganic barrier layer formed of an inorganic material, an organic barrier formed of an organic material and disposed on an upper side of the first inorganic barrier layer, a second inorganic barrier layer formed of in inorganic material and covering the organic barrier and the first inorganic barrier layer, and a portion formed in the adhesion area; and a projecting portion formed on the first substrate and projected toward the second substrate. At least a portion of the projecting portion is disposed in the adhesion area, and is covered with the multi-barrier. The multi-barrier includes a portion in which the organic barrier is not disposed on the upper side of the at least a portion of the projecting portion.

According to the organic EL display device, the first inorganic barrier layer and the second inorganic barrier layer directly come in contact with each other in the portion in which the organic barrier is not disposed. As a result, it is possible to prevent the first substrate and the second substrate from being separated from each other because of low adhesive properties between the inorganic barrier layer and the organic barrier.

(2) In the above described (1), the first substrate may include a pixel electrode which is provided in each of a plurality of pixels, and the projecting portion may be formed in a bank layer including a partition wall disposed between two adjacent pixel electrodes.

(3) In the above described (1) or (2), a plurality of projecting portions arranged in a direction parallel to the first substrate and the second substrate may be formed as the projecting portion. According to this, it is possible to efficiently prevent the first substrate and the second substrate from being separated from each other.

(4) In the above described (3), the plurality of projecting portions may include a first projecting portion and a second projecting portion, the organic barrier may include a portion positioned between the first projecting portion and the second projecting portion, and a thickness of the portion of the organic barrier may be smaller than a height of the first projecting portion and the second projecting portion. It is possible to efficiently prevent the organic barrier from being formed on the upper side of the projecting portion.

(5) In any one of the above described (1) to (4), the projecting portion may surround a display area. According to this, it is possible to efficiently prevent the first substrate and the second substrate from being separated from each other.

(6) In the above described (5), the projecting portion may be formed into a wall shape which extends along the sealing material.

(7) In any one of the above described (1) to (6), the first substrate may be provided with a planarization film, the planarization film may include an opening extending along the sealing material in the adhesion area, the projecting portion may be formed on the planarization film, and include a portion which is formed in the opening of the planarization film. According to this, it is possible to prevent the moisture which infiltrates from an edge of the planarization film from infiltrating into the planarization film to the display area.

(8) In the above described (7), the projecting portion may be formed in the opening of the planarization film. According to this, the projecting portion is not required to avoid the opening of the planarization film, and thus the width of the opening of the planarization film can be made greater.

(9) In the above described (8), a plurality of projecting portions arranged in a direction parallel to the first substrate and the second substrate are formed as the projecting portion formed in the opening of the planarization film. It is easy to secure an area in which the first inorganic barrier layer and the second inorganic barrier layer directly come in contact to each other.

(10) In any one of the above described (1) to (9), the first inorganic barrier layer and the second inorganic barrier layer may come in contact with each other in an area overlapping the projecting portion on the multi-barrier.

DETAILED DESCRIPTION OF THE INVENTION

Figure 1:
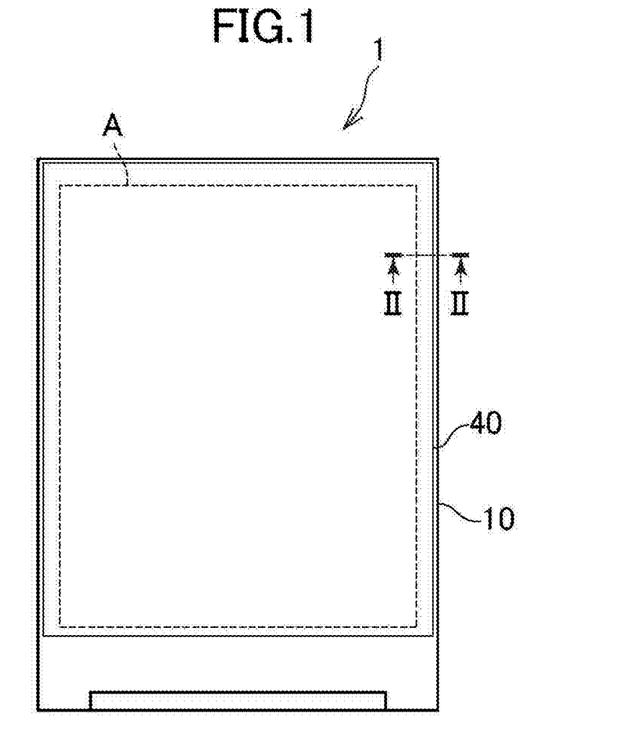
FIG. 1 is a plan view of an organic EL display according to the invention.
Figure 2:
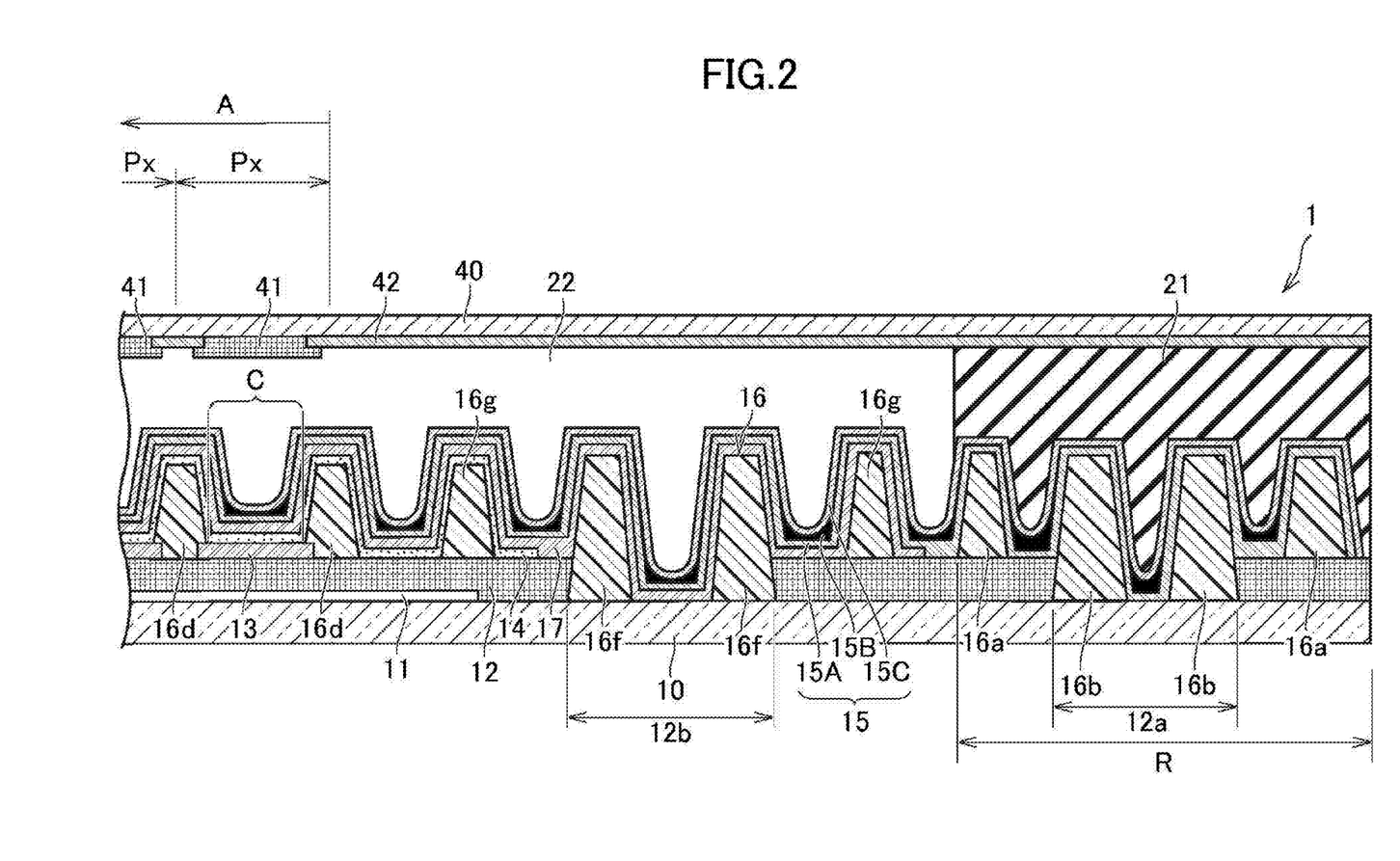
FIG. 2 is a sectional view taken along line II-II shown in FIG. 1.

Hereinafter, an embodiment of the invention will be described. FIG. 1 is a plan view of an organic EL display 1 according to the invention. FIG. 2 is a sectional view taken along line II-II shown in FIG. 1. In the present specification, an "upper direction" indicates a direction toward a second substrate 40 from a first substrate 10, a "lower direction" indicates a direction toward the first substrate 10 from the second substrate 40.

Disclosure of the present specification is merely only an example. Thus, embodiments which maintain the spirit of the invention and are easily modified by those skilled in the art is surely contained in the scope of the invention. In addition, a width, a thickness, and a shape of each portion shown in the drawings may be schematically represented. Therefore, the description of the width, and the thickness of each portion in the drawings is merely an example, and does not limit the interpretation of the invention.

As illustrated in FIG. 2, the organic EL display device 1 includes a first substrate 10 and a second substrate 40 facing the first substrate 10. The substrates 10 and 40 are, for example, transparent substrates formed of glass or a resin. The circuit layer 11 is formed on the first substrate 10. The circuit layer 11 includes an electronic line such as a scanning line, a data signal line, and a power supply line. In addition, the circuit layer 11 includes a thin film transistor (TFT) for controlling power supply to the organic layer 14. The circuit layer 11 is covered with a planarization film 12. A plurality of pixel electrodes 13 are disposed on the upper side of the planarization film 12. The organic EL display device 1 includes the display area A (refer to FIG. 1) which is defined by a plurality of pixels Px. The pixel electrode 13 is provided in each of the plurality of pixels Px. The pixel electrode 13 is connected to the TFT of the circuit layer 11 through a contact hole (not shown) formed on the planarization film 12.

The bank layer 16 including a partition wall 16d is formed on the first substrate 10. The partition wall 16d is disposed on the planarization film 12, and is positioned between two adjacent pixel electrodes 13. The partition wall 16d may overlap the outer periphery of each of the pixel electrodes 13. A bank opening C positioned in each of the pixels Px is formed in the bank layer 16 (the bank opening C is an area which is surrounded by the partition wall 16d). The pixel electrode 13 is exposed in the bank opening C. The bank layer 16 is formed of, for example, a photosensitive resin material. The bank layer 16 may be formed of the inorganic material such as SiN. In addition to the partition wall 16d, the projecting portions 16a, 16b, 16f, and 16g are formed on the bank layer 16. The projecting portions 16a, 16b, 16f, and 16g will be described below.

The organic layer 14 including a light emitting layer is formed on the first substrate 10. The organic layer 14 is formed on the pixel electrode 13 and the bank layer 16, and is in contact with the pixel electrode 13 inside the bank opening C. The organic layer 14 may include a charge injection layer, a charge transfer layer, or the like (here, a charge includes both a positive hole and an electron). A common electrode 17 overlapping the plurality of pixels Px is formed on the organic layer 14. The common electrode 17 is in contact with the organic layer 14. The partition wall 16d of the bank layer 16 prevents a short-circuit from occurring between the outer periphery of the pixel electrode 13 and the common electrode 17.

For example, the common organic layer 14 is formed in the entire display area A. In this case, the organic layer 14 includes a plurality of light emitting layers which have different emitting colors from each other (the color filter system) so as to emit white light. In another example, each of the plurality of pixels has the light emitting layer formed therein in response to the pixel color (a separate coloring system). For example, a light emitting layer which emits red light is formed in a red pixel, and a light emitting layer which emits blue light is formed in a blue pixel. In addition, the organic layer 14 includes a light emitting layer which emits a specific color such as the blue light, and the organic layer 14 may be formed in the entire display area (a color conversion system). As an example, a color filter organic EL display device 1 is illustrated in FIG. 2.

A multi-barrier 15 covering the organic layer 14 and the common electrode 17 is formed on the first substrate 10. The multi-barrier 15 is formed on the upper side of the organic layer 14 and the common electrode 17, and includes a portion which is formed on the outside further than the outer periphery of the organic layer 14 and the common electrode 17. In the example of FIG. 2, the common electrode 17 spreads toward the outside further than the outer periphery of the organic layer 14. The multi-barrier 15 spreads toward the outside further than the outer periphery of the common electrode 17. For example, the multi-barrier 15 is formed on the entire first substrate 10.

The multi-barrier 15 includes a first inorganic barrier layer 15A, an organic barrier 15B disposed on the first inorganic barrier layer 15A, and a second inorganic barrier layer 15C covering the first inorganic barrier layer 15A and the organic barrier 15B. The first inorganic barrier layer 15A and the second inorganic barrier layer 15C are formed of inorganic materials. A material of the inorganic barrier layers 15A and 15C is an inorganic material capable of preventing the moisture from infiltrating into the organic layer 14. The inorganic material is, for example, SiN, but is not limited to thereto. Each of the first inorganic barrier layer 15A and the second inorganic barrier layer 15C may be formed of not only one layer but also formed of a plurality of layers. For example, the first inorganic barrier layer 15A may include an SiN layer and an SiO layer. The organic barrier 15B is formed of the organic material. Examples of materials of the organic barrier 15B include an acrylic resin, a polyimide resin, epoxy resin, and the like.

The organic layer 14, the common electrode 17, and the first inorganic barrier layer 15A are formed on the upper side of the bank layer 16, and have undulations in response to the convexo-concave of the bank layer 16. The organic barrier 15B is dispersedly disposed on the first inorganic barrier layer 15A. Specifically, the organic barrier 15B is stored in a corner in the bank opening C or a portion between two adjacent projecting portions 16a, 16b, 16f, and 16g. The organic barrier 15B is not formed on the upper side of the partition wall 16d of the bank layer 16, or on the upper side of the projecting portions 16a, 16b, 16f, and 16g. In addition, in a case where the foreign particle exists below the multi-barrier 15, the organic barrier 15B is formed so as to surround the foreign particle.

The organic barrier 15B is, for example, formed as follows. The first inorganic barrier layer 15A is formed on the common electrode 17 by using, for example, a CVD method. Thereafter, a solvent which is obtained by mixing the organic material and a polymerization initiator is made into a spray state and then sprayed onto the first inorganic barrier layer 15A in a vacuum state. In that process, the supplying conditions of the solvent (a supplying time, the temperature of a substrate, the atmosphere for forming a film, or the like) are adjusted so that the organic material does not form a film on the first inorganic barrier layer 15A. The organic materials attached on the first inorganic barrier layer 15A exhibit behavior as a liquid. For this reason, the organic material is stored in the recessed portion which is made in the bank layer 16 and the first inorganic barrier layer 15A or the corner thereof. The organic material stored in the recessed portion or the corner thereof becomes the organic barrier 15B. Thus, the organic barrier 15B is formed in the recessed portion at the corner on the inner side of the bank opening C and between two adjacent projecting portions 16a, 16b, 16f, and 16g. In a case where the foreign particle exists, the organic material coheres around the foreign particle due to the surface tension. Accordingly, the organic barrier 15B is formed around the foreign particle. The second inorganic barrier layer 15C is formed on the upper side of the organic barrier 15B.

Figure 3:
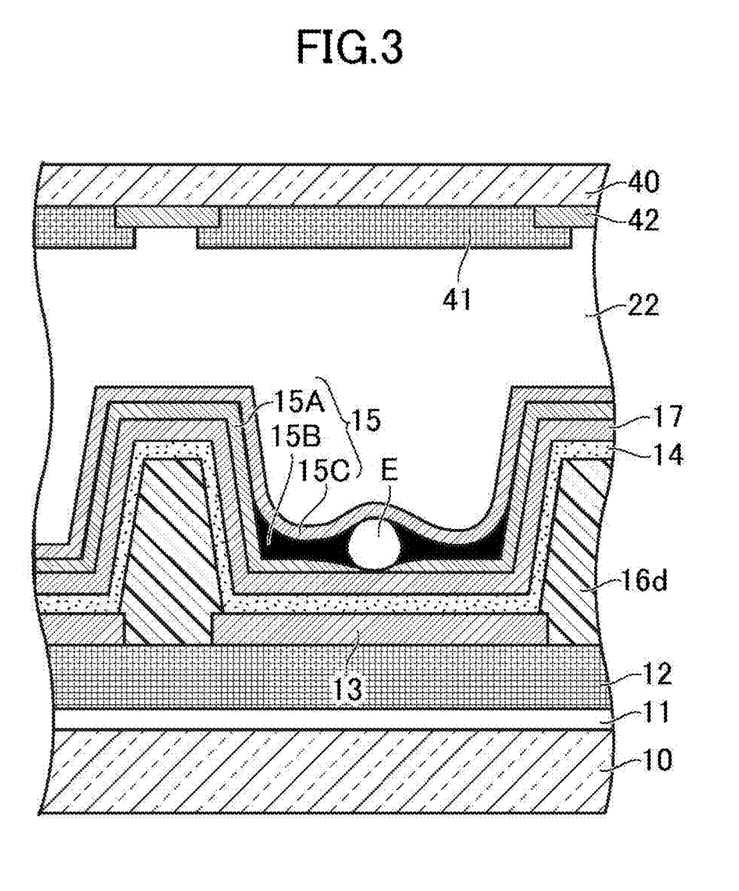
FIG. 3 is a sectional view illustrating a function of an organic barrier, and illustrating the organic barrier which is formed around a foreign particle.

FIG. 3 is a sectional view illustrating a function of the organic barrier 15B, and illustrates the organic barrier 15B formed around a foreign particle E. As illustrated in FIG. 3, the foreign particle E is greater than the thickness of the first inorganic barrier layer 15A, and thus the foreign particle E may not be covered with the first inorganic barrier layer 15C in some cases. In this case, in the process of forming the organic barrier 15B, the liquid organic material coheres around the foreign particle E due to the surface tension. As a result, a gentle slope is formed around the foreign particle E by the organic barrier 15B. The slope in which the organic barrier 15B is formed prevents the second inorganic barrier layer 15C from being disconnected around the foreign particle E. As a result, it is possible to prevent the pin hole which is caused by the foreign particle E from being formed in the multi-barrier 15.

As illustrated in FIG. 2, a sealing material 21 is disposed between the first substrate 10 and the second substrate 40. The first substrate 10 and the second substrate 40 are bonded to each other by the sealing material 21. The sealing material 21 is formed so as to surround the entire periphery of the display area A. The sealing material 21 is disposed along the outer periphery of the second substrate 40, the outer periphery of the second substrate 40 is attached to the first substrate 10. The sealing material 21 may be disposed inwardly from the outer periphery of the second substrate 40. In addition, the sealing material 21 may be disposed inwardly from the outer periphery of the first substrate 10. The organic EL display device 1 includes the adhesion area R overlapping the sealing material 21 in planar view of the first substrate 10 and the second substrate 40. The adhesion area R is defined as an area positioned below the sealing material 21 and including the width corresponding to the sealing material 21. The multi-barrier 15 and the bank layer 16 include portions formed in the adhesion area R, and the sealing material 21 is bonded to the first substrate 10 through the portion of the multi-barrier 15 and the bank layer 16. In the example illustrated in FIG. 2, the sealing material 21 directly comes in contact with the multi-barrier 15. However, the sealing material 21 may not directly come in contact with the multi-barrier 15. A filler 22 is filled between the first substrate 10 and the second substrate 40 and inside the sealing material 21.

The second substrate 40 in the example illustrated in FIG. 2 includes a color filter 41 in each of the pixels Px. In a case where the organic EL display device 1 employs the above described separate coloring system, the color filter 41 may not be provided on the second substrate 40. A black matrix 42 is formed on the second substrate 40 so as to partition off the adjacent pixels Px.

As illustrated in FIG. 2, the bank layer 16 includes the projecting portions 16a and 16b which are swollen toward the second substrate 40 in the adhesion area R. The multi-barrier 15 covers the projecting portions 16a and 16b. The multi-barrier 15 includes, on the upper side and the side surface of the projecting portions 16a and 16b, a portion in which the organic barrier 15B is not disposed. In the portion in which the organic barrier 15B is not disposed, the first inorganic barrier layer 15A and the second inorganic barrier layer 15C directly is in contact with each other. As a result, it is possible to prevent the first substrate 10 and the second substrate 40 from being separated from each other because of low adhesive properties between the inorganic barrier layers 15A and 15C, and the organic barrier 15B. As described above, the material of the organic barrier 15B represents the behavior as the liquid in the process of forming the organic barrier 15B. Therefore, in the process of forming the organic barrier 15B, the material of the organic barrier 15B is moved an area around the projecting portions 16a and 16b (an area between the two adjacent projecting portions) from the upper side of the projecting portions 16a and 16b. Due to this movement, a portion in which the organic barrier 15B does not exist is formed on the upper side of the projecting portions 16a and 16b.

The thickness of the first inorganic barrier layer 15A is set such that the first inorganic barrier layer 15A has the undulation caused by the projecting portions 16a and 16b in the bank layer 16. Due to this undulation, the material of the organic barrier 15B is moved to an area around the projecting portions 16a and 16b from the upper side of the projecting portions 16a and 16b in the process of forming the organic barrier 15B.

For example, the thickness of the second inorganic barrier layer 15C is also set such that the material of the second inorganic barrier layer 15C has an undulation in response to the projecting portions 16a and 16b in the bank layer 16. In the example illustrated in FIG. 2, all of the multi-barriers 15 include the undulation in response to the projecting portions 16a and 16b in the bank layer 16. For example, the thickness of the multi-barrier 15 (a distance between the lower surface of the first inorganic barrier layer 15A and the upper surface of the second inorganic barrier layer 15C) is smaller than the height of the projecting portions 16a and 16b.

The bank layer 16 may include, as illustrated in FIG. 2, a plurality of the projecting portions 16a and 16b which are arranged in the direction (the horizontal direction) parallel to the first substrate 10 and the second substrate 40, in the adhesion area R. With such a configuration, the width of one projecting portion becomes smaller, and thus it is possible to reduce an area in which the material of the organic barrier 15B is stored from being made on the upper side of the projecting portion. As a result, it is possible to efficiently prevent the substrates 10 and 40 from being separated from each other. In the example illustrated in FIG. 2, the bank layer 16 includes two first projecting portions 16a and two second projecting portions 16b which are arranged in the horizontal direction. The plurality of projecting portions 16a and 16b are separately disposed from each other. That is, the bank layer 16 is disconnected between two adjacent projecting portions 16a and 16b. Due to this, the recessed portion between the two adjacent projecting portions becomes deeper, and thus the organic barrier 15B is likely to be stored in the recessed portion. The number of the projecting portion which is formed in the adhesion area R is not limited to that of the above projecting portions 16a and 16b. Alternatively, when viewing a cut section (for example, a cut section in FIG. 2) which is perpendicular to the extending direction of the sealing material 21, the bank layer 16 may include only one projecting portion in the adhesion area R.

As illustrated in FIG. 2, a portion of the organic barrier 15B is stored between two adjacent projecting portions 16a and 16b. The thickness of this portion in the organic barrier 15B is smaller than the height of the projecting portions 16a and 16b. In the example, the height of the second projecting portion 16b is higher than that of the first projecting portion 16a. The thickness of the organic barrier 15B between two adjacent projecting portions 16a and 16b is smaller than the height of the first projecting portion 16a which is lower than that of the second projecting portion 16b. It is possible to efficiently prevent the organic barrier 15B from being formed on the upper side of the projecting portions 16a and 16b by setting the thickness of the organic barrier 15B as described above.

The projecting portions 16a and 16b are formed along the sealing material 21. The projecting portions 16a and 16b are preferably formed so as to surround the entire periphery of the display area A. That is, the projecting portions 16a and 16b are preferably formed along four edges (a right edge, a left edge, a leading edge, and a trailing edge) in the display area A. The positions for the projecting portions 16a and 16b are not limited thereto. For example, the projecting portions 16a and 16b may be provided along two edges (for example, the right edge and the left edge in the display area A) which are positioned on the side opposite to each other. In addition, the projecting portions 16a and 16b may be provided at only one edge in the display area A.

Figure 4A:
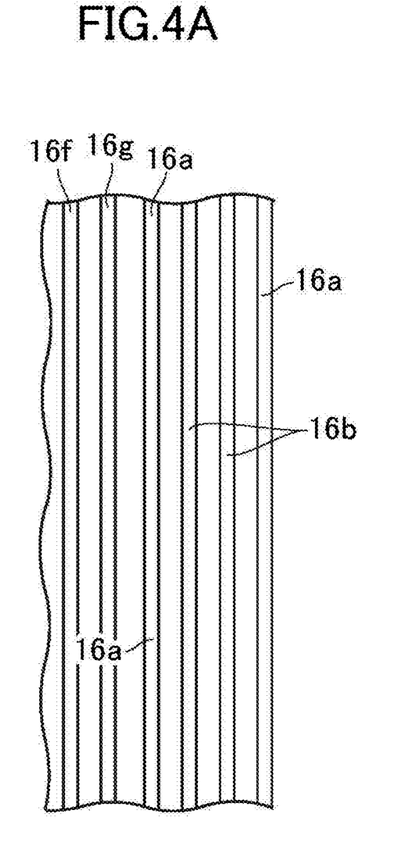
FIGS. 4A and 4B are plan views illustrating an example of a projecting portion in a bank layer.
Figure 4B:
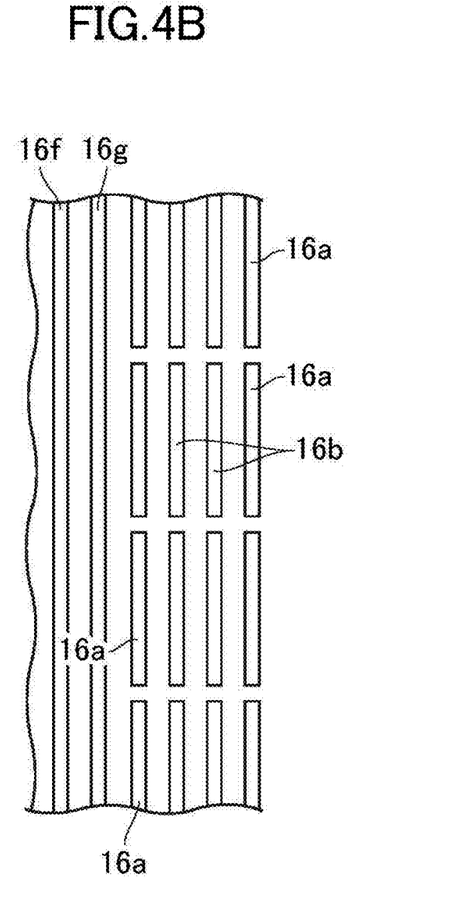

FIGS. 4A and 4B are plan views illustrating an example of the projecting portions 16a and 16b. As illustrated in FIG. 4A, the projecting portions 16a and 16b are formed into a wall shape which extends to, for example, the sealing material 21.

The projecting portions 16a and 16b in FIG. 4A are continuously provided on the entire periphery thereof. In a case where the projecting portions 16a and 16b surround the entire periphery of the display area A, the projecting portions 16a and 16b are continuously provided on the entire periphery thereof, for example. As another example, as illustrated in FIG. 4B, the plurality of projecting portions 16a and 16b extending along the sealing material 21 may be arranged at certain intervals. In a case where the projecting portions 16a and 16b surround the entire periphery of the display area A, the plurality portions 16a and 16b extending along the sealing material 21 may be arranged at certain intervals, and surround the display area A as a whole. Further, as another example, the projecting portions 16a and 16b may be formed into a column shape projecting toward to the second substrate 40. In this case, the plurality of portions 16a and 16b are arranged along the sealing material 21.

As described above, the planarization film 12 is formed on the first substrate 10. As illustrated in FIG. 2, the opening 12a may be formed on the planarization film 12. The opening 12a is formed in the adhesion area R, and extends along the sealing material 21. The bank layer 16 includes a portion which is formed in the opening 12a. With such a structure, it is possible to prevent the moisture which infiltrates from the edge of the planarization film 12 from infiltrating into the planarization film 12 to the display area A. That is, the moisture infiltration path is shielded by the opening 12a. The sealing material 21 is disposed along the outer periphery edge of the second substrate 40. The opening 12a in the adhesion area R shields the moisture at the position spaced from the display area A.

As illustrated in FIG. 2, the second projecting portion 16b of the bank layer 16 may be formed in the opening 12a. In this way, the second projecting portion 16b is not required to avoid the opening 12a, and thus the width of the opening 12a of the planarization film 12 can be made greater. As a result, it is possible to efficiently shield moisture infiltration through the planarization film 12. For example, a plurality of the second projecting portions (two projecting portions 16 in the example in FIG. 2) 16b arranged in the horizontal direction may be formed in the opening 12a. A structure of the bank layer 16 is not limited as above. For example, when viewing the cut section (for example, the cut section in FIG. 2) perpendicular to the extending direction of the sealing material 21, only one second projecting portion 16b may be provided in the opening 12a. In addition, more than two second projecting portions 16b arranged in the horizontal direction are formed in the opening 12a.

It is preferable that the opening 12a passes through the planarization film 12 in the thickness direction thereof. With this, it is possible to efficiently suppress the moisture infiltration. In addition, it is preferable that the opening 12a surrounds the entire periphery of display area A. Thus, it is possible to more efficiently suppress the moisture infiltration. In this case, similar to the opening 12a, the second projecting portion 16b may surround the entire periphery of the display area A. Alternatively, a plurality of second projecting portions 16b may be intermittently disposed along the sealing material 21, and formed in the opening 12a.

The bank layer 16 includes the first projecting portion 16a. The first projecting portion 16a is formed on the planarization film 12 unlike the second projecting portion 16b. In the example illustrated in FIG. 2, the first projecting portion 16a is disposed inwardly from the second projecting portion 16b (on the display area A side). In addition, the first projecting portion 16a is also disposed outwardly from the second projecting portion 16b (located toward the outside of the outer periphery side of the organic EL display device 1). The projecting portion formed on the bank layer 16 is not limited to the above description. For example, the first projecting portion 16a may not be necessarily formed. Alternatively, the first projecting portion 16a may be disposed inwardly or outwardly from the second projecting portion 16b.

As illustrated in FIG. 2, the planarization film 12 may include an opening 12b formed on the inner side of the opening 12a (the display area A side of the opening 12a). The opening 12b is positioned on the outer side of the display area A. The opening 12b extends along the outer edge of the display area A. The bank layer 16 includes a portion which is formed in the opening 12b. With such a structure, it is possible to further efficiently prevent the moisture which infiltrates from the edge of the planarization film 12 from infiltrating into the planarization film 12 to the display area A. It is preferable that the opening 12b passes through the planarization film 12 in the thickness direction thereof. With this, it is possible to efficiently suppress the moisture infiltration. In addition, it is preferable that the opening 12b surrounds the entire periphery of display area A. Thus, it is possible to more efficiently suppress the moisture infiltration.

As illustrated in FIG. 2, a third projecting portion 16f may be formed in the opening 12b. According to this structure, the multi-barrier 15 includes a portion in which the organic barrier 15B is not formed on the upper side of the third projecting portion 16f. In this portion, the first inorganic barrier layer 15A and the second inorganic barrier layer 15C directly come in contact with each other, and thus it is possible to prevent the first inorganic barrier layer 15A and the second inorganic barrier layer 15C from being separated from each other. A plurality of third projecting portions 16f (two projecting portions 16f in FIG. 2) arranged in the horizontal direction are formed in the opening 12b. The third projecting portion 16f may surround the entire periphery of the display area A similar to the opening 12b. The plurality of third projecting portions 16f may be intermittently formed along the edge of the display area A.

As illustrated in FIG. 2, the bank layer 16 may include a fourth projecting portion 16g in an area which is located outside the display area A and is located inside the sealing material 21. The fourth projecting portion 16g is formed on the planarization film 12 unlike the third projecting portion 16f. According to this structure, the multi-barrier 15 includes a portion in which the organic barrier 15B is not formed on the upper side of the fourth projecting portion 16g. In this portion, the first inorganic barrier layer 15A and the second inorganic barrier layer 15C directly come in contact with each other, and thus it is possible to prevent the first inorganic barrier layer 15A and the second inorganic barrier layer 15C from being separated from each other. The fourth projecting portion 16g may surround the entire periphery of display area A, and a plurality of fourth projecting portions 16g may be intermittently formed along the edge of the display area A.

As described above, the bank layer 16 includes the projecting portions 16a and 16b which are swollen in the thickness direction of the first substrate 10 in the adhesion area R. The multi-barrier 15 includes a portion in which the organic barrier 15B is not disposed on the upper side of the projecting portions 16a and 16b. Therefore, it is possible to obtain, in the adhesion area R, a portion in which the first inorganic barrier layer 15A and the second inorganic barrier layer 15C directly come in contact with each other. As a result, it is possible to prevent the first substrate 10 and the second substrate 40 from being separated from each other because of low adhesive properties between the inorganic barrier layers 15A and 15C, and the organic barrier 15B.

The invention is not limited to the above-described organic EL display device 1, but may be variously modified.

For example, as described above, when viewing a cut section (for example, a cut section in FIG. 2) which is perpendicular to the extending direction of the sealing material 21, the bank layer 16 may include only one projecting portion in the adhesion area R. In this case, a portion of the projecting portion may not exist in the adhesion area R. For example, a portion of the projecting portion toward the display area A may be located out of the adhesion area R toward the display area A.

In addition, the bank layer 16 may include the recessed portion having the width smaller than the adhesion area R in the adhesion area R. In this case, a swollen portion which is adjacent to the recessed portion functions as the projecting portion in claims.

In addition, the layer on which the projecting portions 16a and 16b are formed is not necessarily to be the bank layer 16. For example, a layer different from the bank layer 16 may be newly provided with the projecting portions 16a and 16b which are positioned below the sealing material 21.

What is claimed is:

1. An organic EL display device comprising:
  a first substrate;
  a second substrate facing the first substrate;
  a sealing material disposed between the first substrate and the second substrate;
  an adhesion area overlapping a position of the sealing material in planar view of the first substrate and the second substrate;
  an organic layer formed on the first substrate, and including a light emitting layer;
  a multi-barrier formed on the first substrate to cover the organic layer, and includes
    a first inorganic barrier layer formed of an inorganic material,
    an organic barrier formed of an organic material and disposed on an upper side of the first inorganic barrier layer,
    a second inorganic barrier layer formed of an inorganic material and covering the organic barrier and the first inorganic barrier layer, and
    a portion formed in the adhesion area; and
  a projecting portion formed on the first substrate, and projected toward the second substrate,
  wherein at least a portion of the projecting portion is located in the adhesion area, and is covered with the multi-barrier, and
  wherein the multi-barrier includes a portion in which the organic barrier is not disposed on the upper side of the at least a portion of the projecting portion.

2. The organic EL display device according to claim 1,
  wherein the first substrate includes a pixel electrode which is provided in each of a plurality of pixels, and
  wherein the projecting portion is formed in a bank layer including a partition wall that is disposed between two adjacent pixel electrodes.

3. The organic EL display device according to claim 1,
  wherein a plurality of projecting portions arranged in a direction parallel to the first substrate and the second substrate are formed as the projecting portion.

4. The organic EL display device according to claim 3,
  wherein the plurality of projecting portions includes a first projecting portion and a second projecting portion,
  wherein the organic barrier includes a portion positioned between the first projecting portion and the second projecting portion, and wherein a thickness of the portion of the organic barrier is smaller than a height of the first projecting portion and the second projecting portion.

5. The organic EL display device according to claim 1, wherein the projecting portion surrounds a display area.

6. The organic EL display device according to claim 5, wherein the projecting portion is formed into a wall shape which extends along the sealing material.

7. The organic EL display device according to claim 1, wherein the first substrate is provided with a planarization film, wherein the planarization film includes an opening extending along the sealing material in the adhesion area, and wherein the projecting portion is formed on the planarization film, and includes a portion which is formed in the opening of the planarization film.

8. The organic EL display device according to claim 7, wherein the projecting portion is formed in the opening of the planarization film.

9. The organic EL display device according to claim 8, wherein a plurality of projecting portions arranged in a direction parallel to the first substrate and the second substrate are formed as the projecting portion formed in the opening of the planarization film.

10. The organic EL display device according to claim 1, wherein the first inorganic barrier layer and the second inorganic barrier layer come in contact with each other in an area overlapping the projecting portion on the multi-barrier.

\* \* \* \* \*